(12) United States Patent
Lee et al.

(10) Patent No.: US 8,767,489 B2
(45) Date of Patent: Jul. 1, 2014

(54) SEMICONDUCTOR MEMORY DEVICE FOR IMPROVING REPAIR EFFICIENCY

(75) Inventors: Myung Hwan Lee, Cheonan-si (KR); Shin Ho Chu, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 13/412,982

(22) Filed: Mar. 6, 2012

(65) Prior Publication Data

US 2012/0257468 A1    Oct. 11, 2012

(30) Foreign Application Priority Data

Apr. 11, 2011  (KR) ......................... 10-2011-0033431

(51) Int. Cl.
*G11C 29/00*    (2006.01)
*G11C 17/16*    (2006.01)

(52) U.S. Cl.
CPC ............ *G11C 29/808* (2013.01); *G11C 29/787* (2013.01); *G11C 17/16* (2013.01)
USPC ........................................ 365/200; 365/225.7

(58) Field of Classification Search
CPC ..... G11C 29/808; G11C 29/787; G11C 17/16
USPC ................................................ 365/200, 225.7
See application file for complete search history.

(56) References Cited

U.S. PATENT DOCUMENTS

| | | | | |
|---|---|---|---|---|
| 6,353,570 | B2 * | 3/2002 | Hwang et al. | 365/225.7 |
| 6,650,576 | B2 * | 11/2003 | Nakajima | 365/200 |
| 7,573,763 | B2 * | 8/2009 | Im et al. | 365/200 |
| 2009/0122589 | A1 | 5/2009 | Chang | |

FOREIGN PATENT DOCUMENTS

| | | |
|---|---|---|
| KR | 1020040006386 A | 1/2004 |
| KR | 1020040093970 A | 11/2004 |

* cited by examiner

*Primary Examiner* — Huan Hoang
*Assistant Examiner* — Tri Hoang
(74) *Attorney, Agent, or Firm* — William Park & Associates Patent Ltd.

(57) ABSTRACT

A semiconductor memory device includes a transmission line configured to transmit a fuse enable signal for performance of a repair operation; a first repair enable signal generation unit configured to receive the fuse enable signal through the transmission line and generate a first repair enable signal for performing a repair operation for a first bank; and a second repair enable signal generation unit configured to receive the fuse enable signal through the transmission line and generate a second repair enable signal for performing a repair operation for a second bank.

17 Claims, 4 Drawing Sheets

SEMICONDUCTOR MEMORY DEVICE FOR IMPROVING REPAIR EFFICIENCY

CROSS-REFERENCES TO RELATED APPLICATIONS

The present application claims priority under 35 U.S.C 119(a) to Korean Application No. 10-2011-0033431, filed on Apr. 11, 2011, in the Korean Intellectual Property Office, which is incorporated herein by reference in its entirety.

BACKGROUND

A semiconductor memory device such as a DRAM has a great number of memory cells. Even if a failure occurs in only one memory cell, the entire semiconductor memory device may be determined as a bad product. However, if the entire semiconductor memory device is discarded as a bad product due to only one failed memory cell, the manufacturing yield would decrease. Thus, in a semiconductor memory device, a repair operation for replacing failed memory cells with redundancy memory cells is performed by a repair circuit so as to increase the manufacturing yield.

SUMMARY

An embodiment of the present invention relates to a semiconductor memory device which can reduce a layout area and can improve repair efficiency.

In one embodiment, a semiconductor memory device includes: a transmission line configured to transmit a fuse enable signal for performance of a repair operation; a first repair enable signal generation unit configured to receive the fuse enable signal through the transmission line and generate a first repair enable signal for performing a repair operation for a first bank; and a second repair enable signal generation unit configured to receive the fuse enable signal through the transmission line and generate a second repair enable signal for performing a repair operation for a second bank.

In another embodiment, a semiconductor memory device including first and second banks includes: a fuse enable signal generation unit arranged at a center portion of the semiconductor memory device and configured to generate a fuse enable signal which is enabled when a fail occurs in a memory cell included in the first bank or the second bank; a first repair enable signal generation unit arranged at a region adjoining the first bank, and configured to receive the fuse enable signal and generate a first repair enable signal for performing a repair operation for the first bank; and a second repair enable signal generation unit arranged at a region adjoining the second bank, and configured to receive the fuse enable signal and generate a second repair enable signal for performing a repair operation for the second bank.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
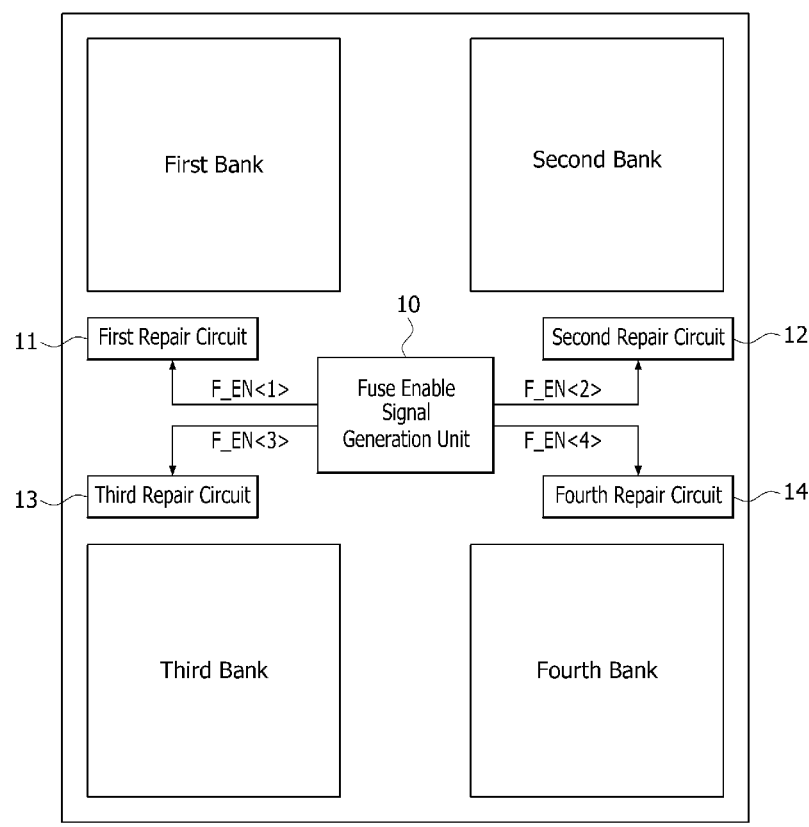
FIGS. 1 and 2 are block diagrams showing the configurations of semiconductor memory devices according to various embodiments of the present invention.
Figure 2:
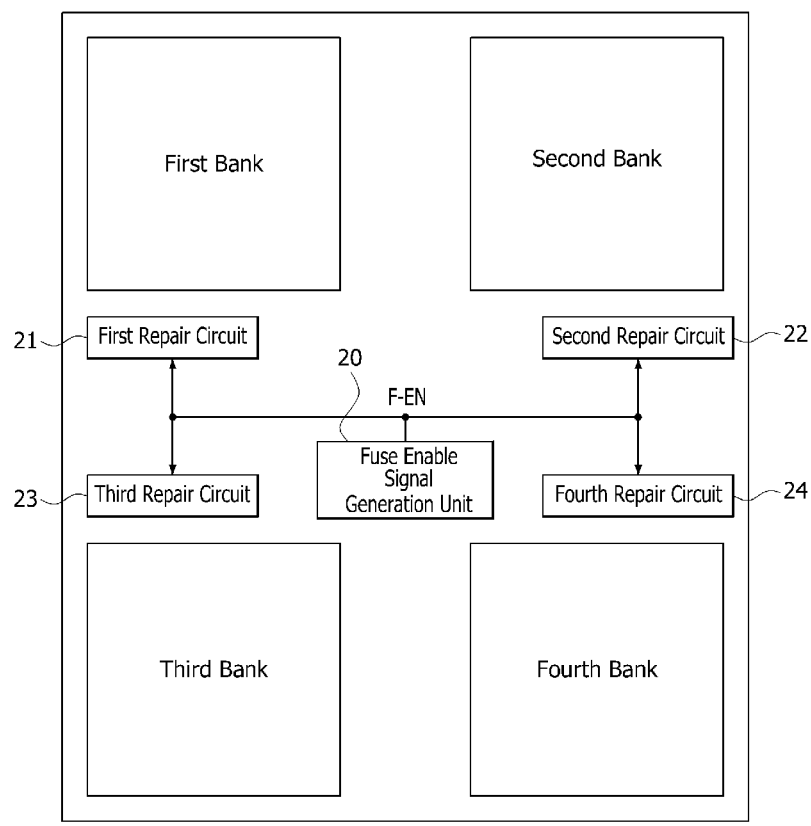

FIGS. 1 and 2 are block diagrams showing configurations of semiconductor memory devices according to various embodiments of the present invention.

The semiconductor memory device shown in FIG. 1 includes a fuse enable signal generation unit 10 arranged at the center portion of a chip and configured to generate first to fourth fuse enable signals F_EN<1:4>, a first repair circuit 11 configured to perform a repair operation for a first bank when an enabled first fuse enable signal F_EN<1> is inputted, a second repair circuit 12 configured to perform a repair operation for a second bank when an enabled second fuse enable signal F_EN<2> is inputted, a third repair circuit 13 configured to perform a repair operation for a third bank when an enabled third fuse enable signal F_EN<3> is inputted, and a fourth repair circuit 14 configured to perform a repair operation for a fourth bank when an enabled fourth fuse enable signal F_EN<4> is inputted.

In the semiconductor memory device configured in this way, the fuse enable signal generation unit 10 generates the first to fourth fuse enable signals F_EN<1:4> for respectively controlling the repair operations for the first to fourth banks. Therefore, as a repair operation is performed only for a bank failed among the first to fourth banks, repair efficiency may be improved.

However, since the first to fourth fuse enable signals F_EN<1:4> for controlling the repair operations for the first to fourth banks are transmitted to the first to fourth repair circuits 11 to 14 through separate transmission lines, a layout area may increase due to the use of the plurality of transmission lines.

The semiconductor memory device shown in FIG. 2 includes a fuse enable signal generation unit 20 arranged at the center portion of a chip and configured to generate a fuse enable signal F_EN, and first to fourth repair circuits 21 to 24 configured to perform repair operations for first to fourth banks when an enabled fuse enable signal F_EN is inputted thereto.

In the semiconductor memory device configured in this way, even when a failure occurs in any one of the memory cells included in the first to fourth banks, the repair operations are performed for all of the first to fourth banks. Because the repair operations for the first to fourth banks are performed by one control signal, that is, the fuse enable signal F_EN, a layout area may be reduced when compared to the semiconductor memory device shown in FIG. 1.

Nevertheless, since the repair operations are performed for all banks even when failures occur in some of the first to fourth banks, repair efficiency may deteriorate.

Figure 3:
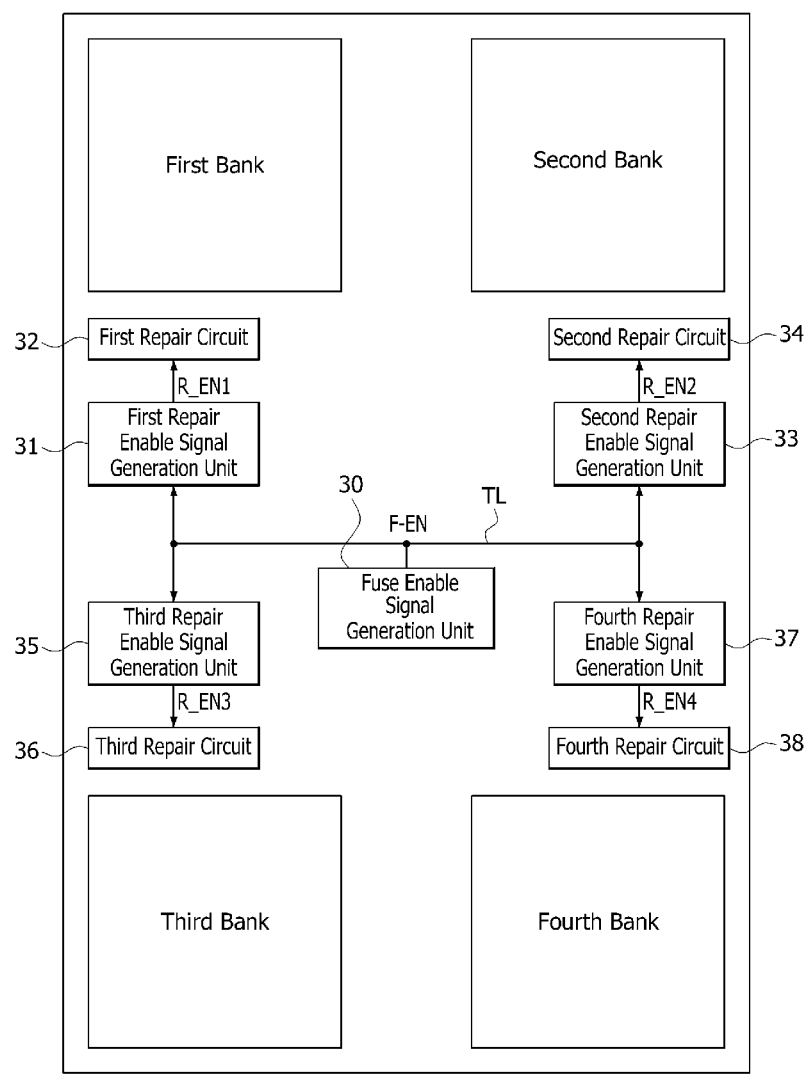
FIG. 3 is a block diagram showing the configuration of a semiconductor memory device in accordance with an embodiment of the present invention, which performs a repair operation.

FIG. 3 is a block diagram showing the configuration of a semiconductor memory device in accordance with an embodiment of the present invention, which performs a repair operation.

Referring to FIG. 3, the semiconductor memory device in accordance with an embodiment of the present invention includes a fuse enable signal generation unit 30, a transmission line TL, a first repair enable signal generation unit 31, a first repair circuit 32, a second repair enable signal generation unit 33, a second repair circuit 34, a third repair enable signal generation unit 35, a third repair circuit 36, a fourth repair enable signal generation unit 37, and a fourth repair circuit 38.

The fuse enable signal generation unit 30 is configured to generate a fuse enable signal F_EN and transmit the fuse enable signal F_EN through the transmission line TL to the first, second, third and fourth repair enable signal generation units 31, 33, 35 and 37. Here, each of the first, second, third and fourth repair enable signal generation units 31, 33, 35 and 37 may adjoin each of first to fourth banks, respectively. The fuse enable signal generation unit 30 has a fuse which may be cut even after packaging is completed, and generates the fuse enable signal F_EN which is enabled to a logic high level when a failure occurs in the memory cell included in at least one bank of the first to fourth banks. According to an example, the fuse included in the fuse enable signal generation unit 30 is in an uncut state when the fused enable signal F_EN enabled to the logic high level is generated.

The first repair enable signal generation unit 31 is coupled between the fuse enable signal generation unit 30 and the first bank. For example, the first repair enable signal generation unit 31 is arranged at a region adjoining the first bank. Also, the first repair enable signal generation unit 31 is configured to receive the fuse enable signal F_EN and generate a first repair enable signal R_EN1 for performing a repair operation for the first bank. The first repair enable signal generation unit 31 includes a fuse which is not cut when a failure occurs in a memory cell included in the first bank, and generates the first repair enable signal R_EN1 which is enabled to a logic high level for performing the repair operation for the first bank having a failure occurred therein.

The first repair circuit 32 is configured to perform the repair operation for the first bank having a failure occurred therein when the first repair enable signal F_EN1 with the logic high level is inputted.

The second repair enable signal generation unit 33 is coupled between the fuse enable signal generation unit 30 and the second bank. For example, the second repair enable signal generation unit 33 is arranged at a region adjoining the second bank. Also, the second repair enable signal generation unit 33 is configured to receive the fuse enable signal F_EN and generate a second repair enable signal R_EN2 for performing a repair operation for the second bank. The second repair enable signal generation unit 33 includes a fuse which is not cut when a failure occurs in a memory cell included in the second bank, and generates the second repair enable signal R_EN2 which is enabled to a logic high level for performing the repair operation for the second bank having a failure occurred therein.

The second repair circuit 34 is configured to perform the repair operation for the second bank having a failure occurred therein when the second repair enable signal F_EN2 with the logic high level is inputted.

The third repair enable signal generation unit 35 is coupled between the fuse enable signal generation unit 30 and the third bank. For example, the third repair enable signal generation unit 35 is arranged at a region adjoining the third bank. Also, the third repair enable signal generation unit 35 is configured to receive the fuse enable signal F_EN and generate a third repair enable signal R_EN3 for performing a repair operation for the third bank. The third repair enable signal generation unit 35 includes a fuse which is not cut when a failure occurs in a memory cell included in the third bank, and generates the third repair enable signal R_EN3 which is enabled to a logic high level for performing the repair operation for the third bank having a failure occurred therein.

The third repair circuit 36 is configured to perform the repair operation for the third bank having a failure occurred therein when the third repair enable signal F_EN3 with the logic high level is inputted.

The fourth repair enable signal generation unit 37 is coupled between the fuse enable signal generation unit 30 and the fourth bank. For example, the fourth repair enable signal generation unit 37 is arranged at a region adjoining the fourth bank. Also, the fourth repair enable signal generation unit 37 is configured to receive the fuse enable signal F_EN and generate a fourth repair enable signal R_EN4 for performing a repair operation for the fourth bank. The fourth repair enable signal generation unit 37 includes a fuse which is not cut when a failure occurs in a memory cell included in the fourth bank, and generates the fourth repair enable signal R_EN4 which is enabled to a logic high level for performing the repair operation for the fourth bank having a failure occurred therein.

The fourth repair circuit 38 is configured to perform the repair operation for the fourth bank having a failure occurred therein when the fourth repair enable signal F_EN4 with the logic high level is inputted.

Figure 4:
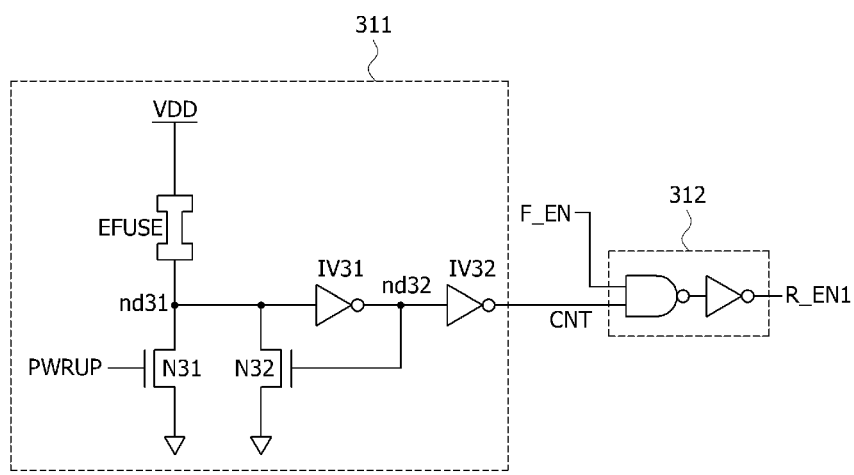
FIG. 4 is a circuit diagram of the repair enable signal generation unit included in the semiconductor memory device shown in FIG. 3.

Referring to FIG. 4, the first repair enable signal generation unit 31 includes a control signal generating section 311 configured to generate a control signal CNT depending upon whether a fuse EFUSE cut or not, and an output section 312 configured to generate the first repair enable signal R_EN1 which is enabled when both the fuse enable signal F_EN and the control signal CNT are enabled to logic high levels. Here, a fuse cutting operation for the fuse EFUSE may be performed even after packaging is completed. For example, the fuse EFUSE may be an e-fuse.

The control signal generating section 311 includes the fuse EFUSE which is connected between a power supply voltage VDD and a node nd31, an NMOS transistor N31 which is connected between the node nd31 and a ground voltage and pull-up drives the node nd31 in response to a power-up signal PWRUP, an inverter IV31 which buffers the signal of the node nd31, an NMOS transistor N32 which is connected between the node nd31 and the ground voltage and pull-down drives the node nd31 in response to the output signal of the inverter IV31, and an inverter IV32 which buffers the signal of a node nd32.

Since the fuse EFUSE is not cut when a failure is detected by performing a test for the memory cells included in the first bank after packaging is completed, the control signal generating section 311 generates the control signal CNT with the logic high level. Because the fuse enable signal F_EN is enabled to the logic high level by the failure occurred in a memory cell included in the first bank, the first repair enable signal R_EN1 outputted from the output section 312 is enabled to the logic high level.

Since the second repair enable signal generation unit 33, the third repair enable signal generation unit 35 and the fourth repair enable signal generation unit 37 may be easily realized on the basis of the configuration of the first repair enable signal generation unit 31, detailed description thereof will be omitted herein.

The repair operation of the semiconductor memory device in accordance with the embodiment of the present invention configured as mentioned above will be described below on the assumption that a failure occurs only in a memory cell included in the first bank among the first to fourth banks, as a result of performing a test with packaging completed.

Since a failure has occurred in the memory cell included in the first bank, the fuse enable signal generation unit 30 generates the fuse enable signal F_EN which is enabled to the logic high level.

Since a failure has occurred only in the memory cell included in the first bank, the fuse EFUSE included in the first repair enable signal generation unit 31 is not cut. Accordingly, after a power-up period ends, the NMOS transistor N31 is turned off, the node nd31 is driven to a logic high level, and the control signal CNT is generated to the logic high level. Hence, the first repair enable signal R_EN1 is enabled to the logic high level, and drives the first repair circuit 32 for performing the repair operation for the first bank.

Since a failure has occurred only the memory cell included in the first bank, the fuses included in the second repair enable signal generation unit 33, the third repair enable signal generation unit 35 and the fourth repair enable signal generation unit 37 are cut. Accordingly, all the second to fourth repair enable signals R_EN2 to R_EN4 are disabled to logic low levels, and the repair operations for the second to fourth banks are not performed.

In the semiconductor memory device in accordance with an embodiment of the present invention, in the case where a failure has occurred in at least one bank among the first to fourth banks, since the fuse enable signal F_EN is generated and is transmitted to the regions each adjoining the first to fourth banks respectively, it is possible to prevent a layout area from increasing due to use of an increased number of transmission lines. Also, due to the fact that the semiconductor memory device in accordance with an embodiment of the present invention includes the first repair enable signal generation unit 31 coupled between the fuse enable signal generation unit 30 and the first bank and configured to control the repair operation for the first bank, the second repair enable signal generation unit 33 coupled between the fuse enable signal generation unit 30 and the second bank and configured to control the repair operation for the second bank, the third repair enable signal generation unit 35 coupled between the fuse enable signal generation unit 30 and the third bank and configured to control the repair operation for the third bank and the fourth repair enable signal generation unit 37 coupled between the fuse enable signal generation unit 30 and the fourth bank and configured to control the repair operation for the fourth bank, a repair operation may be performed only for a bank, having a failure occurred therein, among the first to fourth banks, whereby repair efficiency may be improved.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
    a transmission line configured to transmit a fuse enable signal for performance of a repair operation;
    a first control signal generating section configured to generate a first control signal depending upon a cutting state of a first fuse;
    a first output section configured to output a first repair enable signal which is enabled when both the first control signal and the fuse enable signal are enabled;
    a second control signal generating section configured to generate a second control signal depending upon a cutting state of a second fuse; and
    a second output section configured to output a second repair enable signal which is enabled when both the second control signal and the fuse enable signal are enabled, wherein the first fuse is cut in response to a failure occurring in a memory cell included in the first bank, and the second fuse is cut in response to a failure occurring in a memory cell included in the second bank.

2. The semiconductor memory device according to claim 1, further comprising:
    a fuse enable signal generation unit configured to generate the fuse enable signal which is enabled when a failure occurs in a memory cell included in the first bank or the second bank.

3. The semiconductor memory device according to claim 2, wherein a fuse cutting operation for a fuse of the fuse enable signal generation unit is performed after packaging is completed.

4. The semiconductor memory device according to claim 3, wherein the fuse is cut when a failure does not occur in a memory cell included in the first bank or the second bank.

5. The semiconductor memory device according to claim 1, wherein a fuse cutting operation for the first fuse is performed after packaging is completed.

6. The semiconductor memory device according to claim 5, wherein the first fuse is cut when a failure does not occur in a memory cell included in the first bank.

7. The semiconductor memory device according to claim 1, wherein a fuse cutting operation for the second fuse is performed after packaging is completed.

8. The semiconductor memory device according to claim 7, wherein the second fuse is cut when a failure does not occur in a memory cell included in the second bank.

9. The semiconductor memory device according to claim 1, further comprising:
    a first repair circuit configured to perform the repair operation for the first bank when the first repair enable signal is enabled; and
    a second repair circuit configured to perform the repair operation for the second bank when the second repair enable signal is enabled.

10. A semiconductor memory device including first and second banks, comprising:
    a fuse enable signal generation unit arranged at a center portion of the semiconductor memory device and configured to generate a fuse enable signal which is enabled when a failure occurs in a memory cell included in the first bank or the second bank;
    a first control signal generating section configured to generate a first control signal depending upon a cutting state of a first fuse;
    a first output section configured to output a first repair enable signal which is enabled when both the first control signal and the fuse enable signal are enabled;
    a second control signal generating section configured to generate a second control signal depending upon a cutting state of a second fuse; and
    a second output section configured to output a second repair enable signal which is enabled when both the second control signal and the fuse enable signal are enabled, wherein the first fuse is cut in response to a failure occurring in a memory cell included in the first bank, and the second fuse is cut in response to a failure occurring in a memory cell included in the second bank.

11. The semiconductor memory device according to claim 10, wherein a fuse cutting operation for a fuse of the fuse enable signal generation unit is performed after packaging is completed.

12. The semiconductor memory device according to claim 11, wherein the fuse is cut when a failure does not occur in a memory cell included in the first bank or the second bank.

13. The semiconductor memory device according to claim 10, wherein a fuse cutting operation for the first fuse is performed after packaging is completed.

14. The semiconductor memory device according to claim 13, wherein the first fuse is cut when a failure does not occur in a memory cell included in the first bank.

15. The semiconductor memory device according to claim 10, wherein a fuse cutting operation the second fuse is performed after packaging is completed.

16. The semiconductor memory device according to claim 15, wherein the second fuse is cut when a failure does not occur in a memory cell included in the second bank.

17. The semiconductor memory device according to claim 10, further comprising:
- a first repair circuit configured to perform the repair operation for the first bank when the first repair enable signal is enabled; and
- a second repair circuit configured to perform the repair operation for the second bank when the second repair enable signal is enabled.

* * * * *